United States Patent

Ohwaki et al.

[11] Patent Number: 5,913,173
[45] Date of Patent: Jun. 15, 1999

[54] RADIO FREQUENCY DEVICE

[75] Inventors: Haruki Ohwaki, Gifu; Hiroshi Nagai, Aichi; Tsuyoshi Horie, Gifu; Seiji Matsushita, Aichi, all of Japan

[73] Assignee: Matsushita Electric Industrial Co., Ltd., Osaka, Japan

[21] Appl. No.: 08/838,722

[22] Filed: Apr. 9, 1997

[30] Foreign Application Priority Data

Apr. 10, 1996 [JP] Japan ..................................... 8-087869

[51] Int. Cl.⁶ .................................................. H04Q 7/32
[52] U.S. Cl. ............................................................ 455/550
[58] Field of Search .............................. 455/550, 90, 130

[56] References Cited

U.S. PATENT DOCUMENTS 5,200,997  4/1993  Leman ...................................... 379/428
5,271,056  12/1993  Pesola et al. ............................ 455/550

*Primary Examiner*—William Cumming
*Attorney, Agent, or Firm*—Pearne, Gordon, McCoy & Granger LLP

[57] ABSTRACT

A radio-frequency device has a distributor and a tuner. The distributor has an input terminal which is disposed on one side face of a case; an output terminal which is disposed on another side face; and an output terminal which is disposed on the upper side face. The output terminal, and an input terminal of the tuner are respectively protruded at positions which are separated from the bottom face by a substantially same distance. A metal flat plate portion is led out from the side of the distributor and coupled to a receiving portion of the tuner on the side of the input terminal. Therefore, the output terminal of the distributor is directly connected to the input terminal of the tuner, so that a radio-frequency cable for connecting the units to each other is not necessary. A space reduction and a low production cost can be realized.

11 Claims, 6 Drawing Sheets

RADIO FREQUENCY DEVICE

BACKGROUND OF THE INVENTION

The invention relates to a radio-frequency device having plural radio-frequency units which function independently of each other.

Conventionally, as shown in FIG. 9, a radio-frequency device is configured by a distributor 1, and a tuner 3 connected to a first output 2 of the distributor 1. The distributor 1 and the tuner 3 are connected to each other by a radio-frequency cable 4. A second output 5 of the distributor 1 is connected to another tuner 6 by a radio-frequency cable 7.

According to thus configured radio-frequency device, for example, it is possible to enjoy a two-picture television by means of the outputs of the tuners 3 and 6, or to enjoy a television screen by means of the output of the tuner 3 while recording another program by means of the output of the tuner 6.

In the configuration of the conventional art, however, the distributor 1 and the tuner 3 are connected to each other by the radio-frequency cable 4, and hence a large extra space is required for the connection by means of the radio-frequency cable 4. The provision of the cable 4 increases the production cost.

SUMMARY OF THE INVENTION

The invention can solve these problems. It is an object of the invention to provide a radio-frequency device which can realize a reduction of a space and a low production cost.

In order to attain the object, the radio-frequency device of the invention comprises: a first radio-frequency unit; and a second radio-frequency unit which is detachably coupled to the first radio-frequency unit, the first and second radio-frequency units having a substantially same height and functioning independently of each other, each of the first and second radio-frequency units being housed in a metal case, the first radio-frequency unit has: an input terminal for a radio-frequency signal which is disposed on one side face of the case; and a first output terminal for a radio-frequency signal which is disposed on another side face, the first output terminal and an input terminal of the second radio-frequency unit are respectively protruded at positions which are separated from a bottom face by a substantially same distance, a metal flat plate portion is led out from the side of the first output terminal, and the flat plate portion is coupled to a receiving portion of the second radio-frequency unit on the side of the input terminal.

According to this configuration, the space can be reduced and the production cost can be lowered.

According to the invention, a radio-frequency device comprises a first radio-frequency unit and a second radio-frequency unit which is detachably coupled to the first radio-frequency unit, the first and second radio-frequency units having a substantially same height and functioning independently of each other, each of the first and second radio-frequency units being housed in a metal case. The first radio-frequency unit has an input terminal for a radio-frequency signal which is disposed on one side face of the case; and a first output terminal for a radio-frequency signal which is disposed on another side face, the first output terminal and an input terminal of the second radio-frequency unit are respectively protruded at positions which are separated from a bottom face by a substantially same distance, a metal flat plate portion is led out from the side of the first output terminal, and the flat plate portion is coupled to a receiving portion of the second radio-frequency unit on the side of the input terminal. Therefore, the first output terminal of the first radio-frequency unit is directly connected to the input terminal of the second radio-frequency unit, so that a radio-frequency cable for connecting the units to each other is not necessary. Consequently, a space reduction and a low production cost can be realized. Furthermore, external interfering signals hardly enter the device, and a chance of adversely affecting the external is lowered.

Further, according to the invention, in the radio-frequency device, the input terminal of the first radio-frequency unit and the input terminal of the second radio-frequency unit are respectively protruded at positions which are separated from the bottom face by a substantially same distance. In place of the radio-frequency device, only the second radio-frequency unit may be directly attached to a hole of a chassis of a receiver set.

Furthermore, according to the invention, in the radio-frequency device, each of the cases of the first and second radio-frequency units comprises a frame, and a cover which is fitted with the frame, and a contact portion disposed on the cover abut against the vicinities of each of the input terminals of the first and second radio-frequency units. The vicinities of each of the input terminals are surely grounded. Consequently, external interfering signals hardly enter the device, and the device does not adversely affect the external.

Furthermore, according to the invention, in the radio-frequency device, a second output terminal is disposed at a position on an upper side face, the position being separated from the input terminal and the first output terminal of the first radio-frequency unit by the same distance. Since the input and output terminals are symmetrical with each other about the second output terminal, the front and rear covers can be commonly used. Therefore, the common use of a mold can realize the reduction of the cost, and only one kind of the cover is used, thereby facilitating the management of the cover.

Furthermore, according to the invention, in the radio-frequency device, a phonoplug is protruded from the first output terminal of the first radio-frequency unit, and a phonojack is disposed in the input terminal of the second radio-frequency unit. Therefore, it is possible to realize a radio-frequency device which can maintain radio-frequency performance suitable for the television broadcasting band and which is low in production cost.

Furthermore, according to the invention, in the radio-frequency device, the first and second radio-frequency units are coupled with each other by fitting a projection disposed at a tip end of the flat plate portion into a hole formed in the receiving portion. The coupling can be conducted surely and firmly. Since the coupling may be conducted after the units are roughly positioned by using the phonoplug and the phonojack, the coupling work may be done in an easy manner.

Furthermore, according to the invention, in the radio-frequency device, the first and second radio-frequency units are coupled with each other by fitting a projection disposed at a tip end of the flat plate portion into a recess formed in a side face of the receiving portion. After the first and second radio-frequency units are roughly positioned by using the phonoplug and the phonojack, the units can be coupled to each other while rotating them. Therefore, the coupling work may be done in a further easy manner.

Furthermore, according to the invention, in the radio-frequency device, an amplifier is connected between an input terminal and a first output terminal of the first radio-frequency unit. Since the amplifier is internally disposed, an input signal is little deteriorated. Even when plural first radio-frequency units are connected in series by using a coupling portion, therefore, an input signal is little deteriorated, and a number of output signals can be obtained.

Furthermore, according to the invention, in the radio-frequency device, the second radio-frequency unit has an amplifier which amplifies an input signal. A coupling portion made of a metal is formed so as to surround the input terminal. Even when an input level is very low, therefore, noises entering from the external are low in level, so that only a desired signal can be largely amplified.

Furthermore, according to the invention, in the radio-frequency device, the first radio-frequency unit comprises: the input terminal; an attenuator connected to the input terminal; a first amplifier connected to an output of the attenuator; a distributor connected to an output of the first amplifier; a second amplifier connected to one output of the distributor; the first output terminal to which an output of the second amplifier is supplied; a third amplifier connected to another output of the distributor; and the second output terminal to which an output of the third amplifier is supplied. When a television broadcasting signal is supplied to the input terminal, the same signal output can be obtained from the first and second output terminals. Therefore, plural independent television receivers can be connected to the device.

Furthermore, according to the invention, in the radio-frequency device, the second radio-frequency unit comprises: the input terminal; a radio-frequency amplifier connected to the input terminal; an input filter connected to an output of the radio-frequency amplifier; a mixer in which an output of the input filter is connected to one input and an output of a local oscillator is connected to another input; an intermediate frequency amplifier to which an output of the mixer is connected; and an output terminal to which an output of the intermediate frequency amplifier is connected. When a signal from the second output terminal of the first radio-frequency unit is coupled to another tuner, it is possible to enjoy a two-picture television, or to enjoy a television screen while recording another program.

DETAILED DESCRIPTION OF PREFERRED EMBODIMENTS

Hereinafter, an embodiment of the invention will be described with reference to the accompanying drawings.

Figure 1:
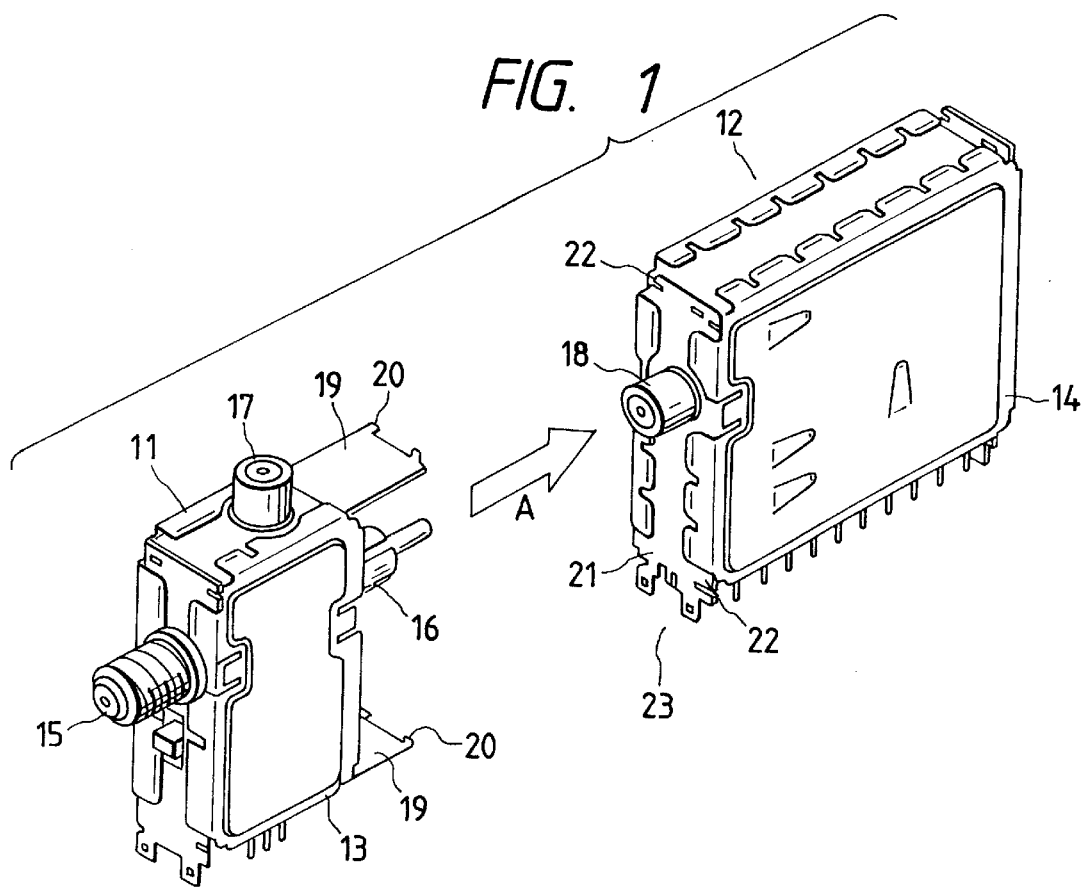
FIG. 1 is an exploded perspective view of a radio-frequency device of an embodiment of the invention.

FIG. 1 is an exploded perspective view of a radio-frequency device of the embodiment. In FIG. 1, reference numeral 11 designates a distributor (used as an example of the first radio-frequency unit), and 12 designates a tuner (used as an example of the second radio-frequency unit.). A case 13 of the distributor 11, and a case 14 of the tuner 12 are formed by an electrically conductive metal. The reference numeral designates an input terminal of the distributor 11 which is an F-type female connector, 16 designates a first output terminal which is disposed on the side face opposed to the input terminal 15 and which is formed by a phonoplug, 17 designates a second output terminal which is disposed on the upper side face of the distributor 11 and which is formed by a phonojack, and 18 designates an input terminal which is disposed on a side face of the tuner 12 and which is formed by a phonojack.

The reference numeral 19 designates flat plate portions which are obtained by bending upper and lower areas of the side face of the distributor 11 on the side of the first output terminal 16, so as to horizontally elongate. In each of the upper and lower flat plate portions, two projections 20 are formed at the side edges of the tip end, respectively. Namely, four projections are formed in total. The projections 20 are fitted into holes 22 which are formed in upper and lower areas of a receiving portion 21 of the side face the tuner 12 on the side of the input terminal 18. After the fitting, fixation is conducted by means of caulking so that the distributor 11 and the tuner 12 are surely coupled to each other. In place of the caulking fixation, fixation by means of soldering may be conducted.

Figure 2:
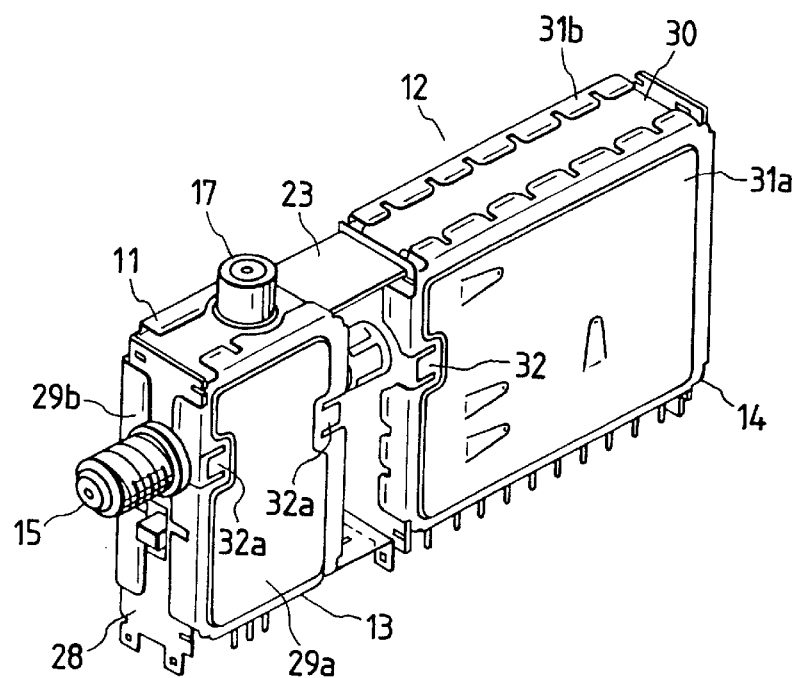
FIG. 2 is a perspective view of the radio-frequency device.

The flat plate portions 19, the projections 20, the receiving portion 21, and the holes 22 constitute a coupling portion 23. FIG. 2 shows a state where the distributor 11 is moved in the direction A so as to attain the coupling. In the coupled state, the phonoplug 16a which is the first output terminal is connected to the phono jack 18a which is the input terminal, thereby supplying the output of the distributor 11 to the tuner 12. The first output terminal 16 and the input terminal 18 are shielded by the side face on the side of the first output terminal 16, the flat plate portions 19, and the receiving portion 21 which is the side face of the tuner 12 on the side of the input terminal 18. Therefore, the terminals are not affected by the external and do not adversely affect the external.

Figure 3:
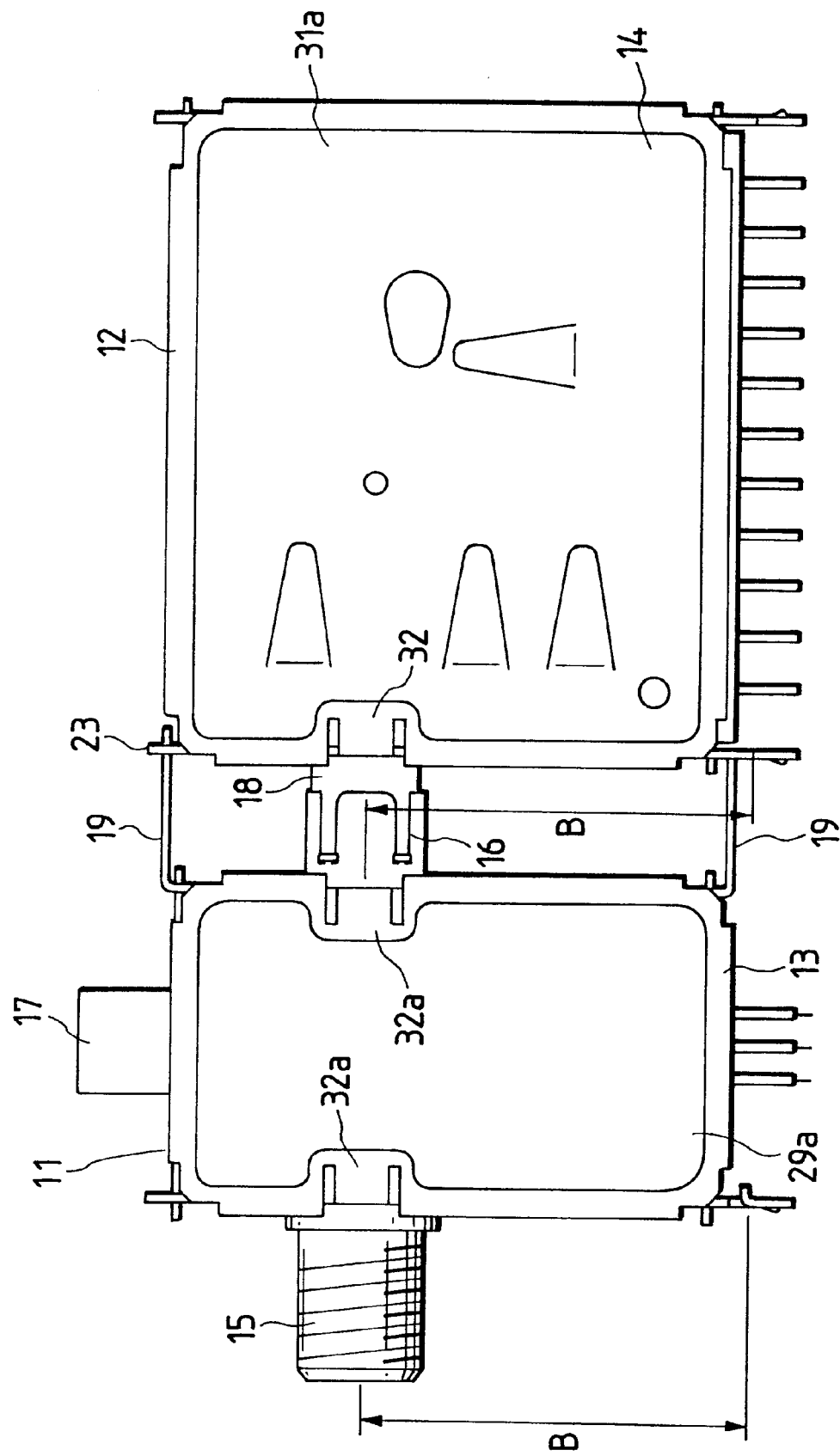
FIG. 3 is a plan view of the radio-frequency device.
Figure 4:
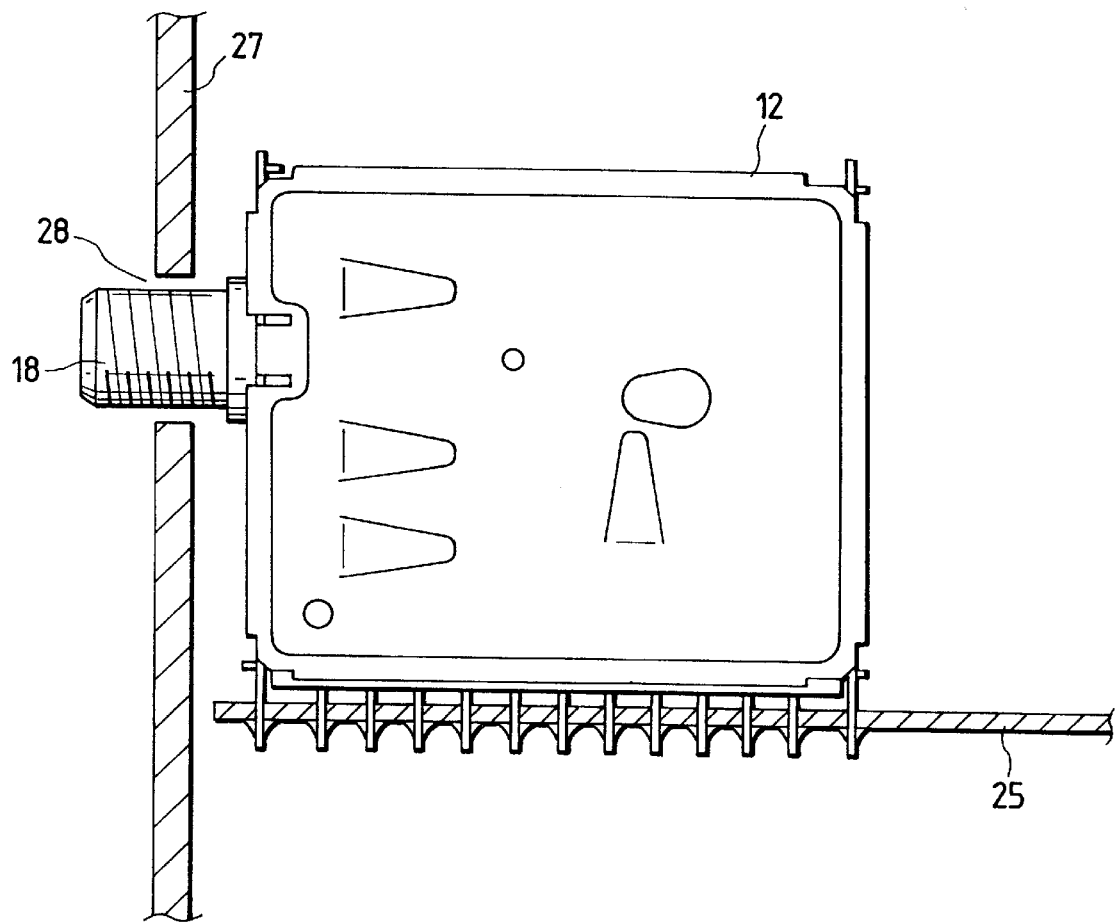
FIG. 4 is a section view showing main portions in the case where a tuner of the radio-frequency device is mounted in a receiver set.
Figure 5:
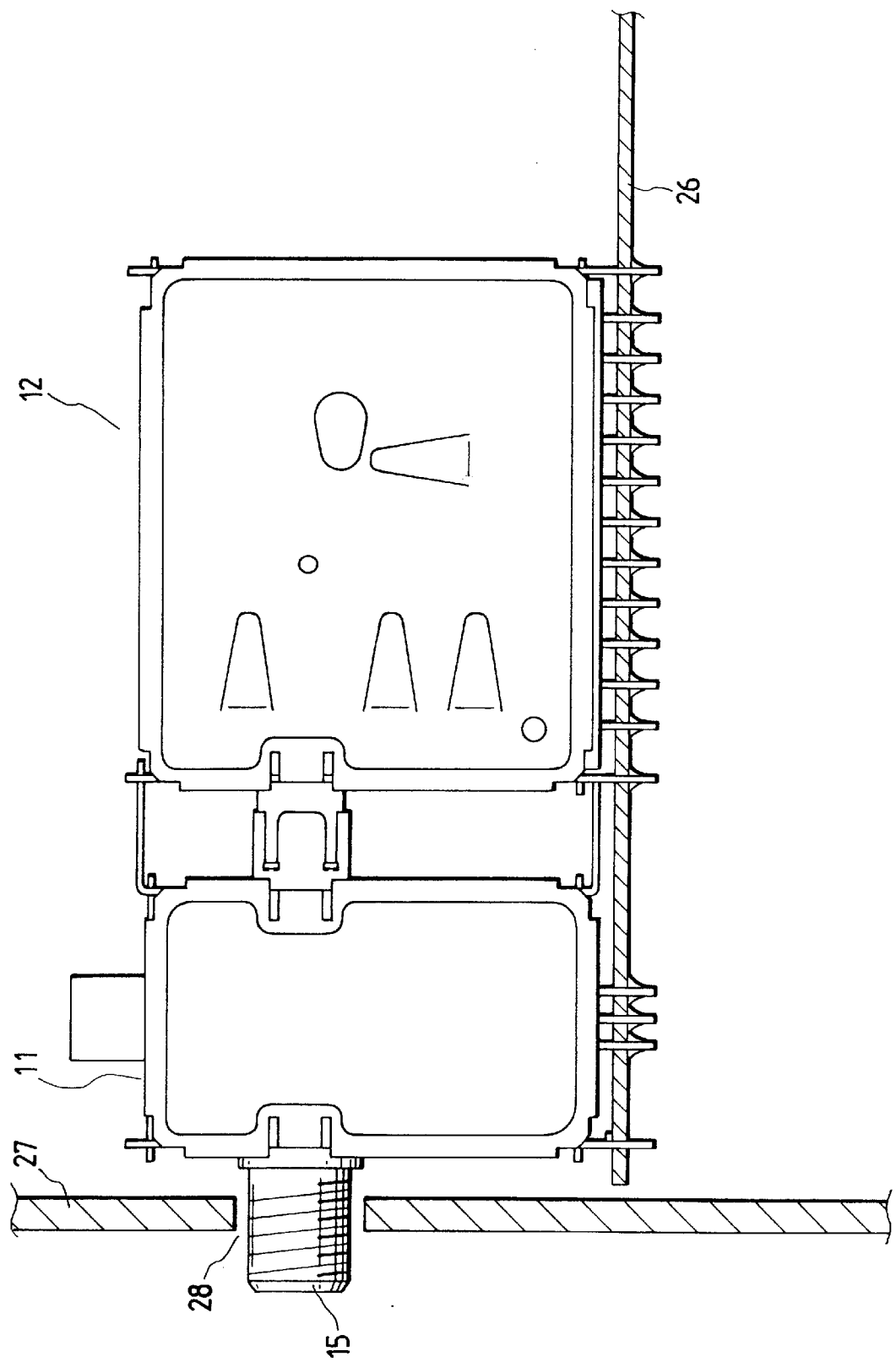
FIG. 5 is a section view showing main portions in the case where the radio-frequency device is mounted in a receiver set.

FIG. 3 is a plan view of the radio-frequency device. Referring to FIG. 3, the input terminal 15 of the distributor 11, the first output terminal 16, and the input terminal 18 of the tuner 12 are respectively protruded at positions which are separated from the bottom face by a substantially same distance B. Therefore, the phonoplug 16a is fitted with the phonojack 18a so that the output of the distributor 11 is transmitted to the tuner 12. FIGS. 4 and 5 show the state where the device is attached to a receiver set. In the figures, 25 and 26 designate main printed circuit boards of the receiver set, and 27 designates a rear side face of the receiver set. The reference numeral 28 designates a hole which is formed in the rear side face 27 and used for inputting a radio-frequency signal. Since the height B of the input terminal 15 of the distributor 11 from the bottom face is equal to that of the input terminal 18 of the tuner 12, only the tuner 12 may be mounted on the main printed circuit board 25. The radio-frequency device may be mounted on the main printed circuit board 26. In these cases, the hole 28 of the rear side face 27 of the receiver set may be commonly used. In this way, either of the radio-frequency units which are independent from each other and have different functions can be mounted without requiring modification of the configuration of the receiver set. This is very important in the point of view of standardization. As the input terminal 18 of the tuner 12, an F-type female connector 18b is used.

Referring to FIGS. 2 and 3, the case 13 of the distributor 11 is configured by a metal frame 28 in which the front and rear faces are opened, and covers 29a and 29b which are respectively fitted with the front and rear faces of the frame 28. In the tuner 12, similarly, the case 14 of the tuner 12 is configured by a metal frame 30 in which the front and rear faces are opened, and covers 31a and 31b which are respectively fitted with the front and rear faces of the frame 30.

The reference numeral 17 designates the second output terminal which is disposed on the upper side face of the distributor 11. A phonojack 17a is protruded at a position separated from the input terminal 15 and the first output terminal 16 by the same distance. In other words, the input terminal 15 and the first output terminal 16 are disposed at positions which are symmetrical with each other about the second output terminal 17. Therefore, identical members may be used as the front and rear face covers 29a and 29b. Therefore, a mold can be commonly used and the management cost can be lowered.

The reference numeral 32 designates contact portions which are respectively disposed on the front and rear face covers 31a and 31b of the tuner 12, and which abut against the frame 30 in the vicinity of the input terminal 18, thereby further improving the shielding performance. In a radio-frequency device, particularly, the Improvement of the shielding performance of the input side is important. Also on the side of the input terminal 15 of the distributor 11, contact portions 32a are disposed on the covers 29a and 29b. The covers 29a and 29b are commonly used. This results in that contact portions 32a are disposed also on the side of the first output terminal 16. Contact portions 32a may be disposed also on the side of the second output terminal 17.

Figure 6:
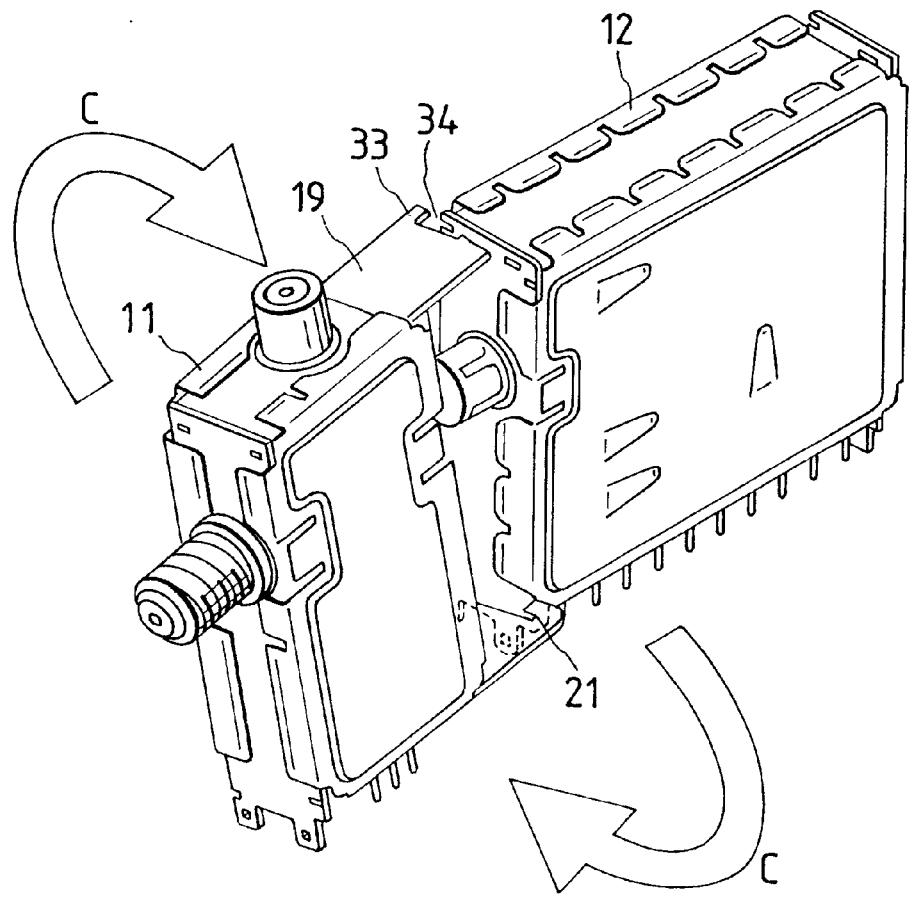
FIG. 6 is an exploded perspective view of another example of a radio-frequency device.

FIG. 6 shows other coupling means. In the coupling means, a projection 33 is formed in one side of the tip end of each of the flat plate portions 19, and recesses 34 are formed in the receiving portion 21 opposing the projections. According to this configuration, the phonoplug 16a is first fitted with the phonojack 18a, and thereafter the distributor 11 is rotated in the direction C, whereby the distributor 11 and the tuner 12 can be coupled with each other in a further easy manner.

Figure 7:
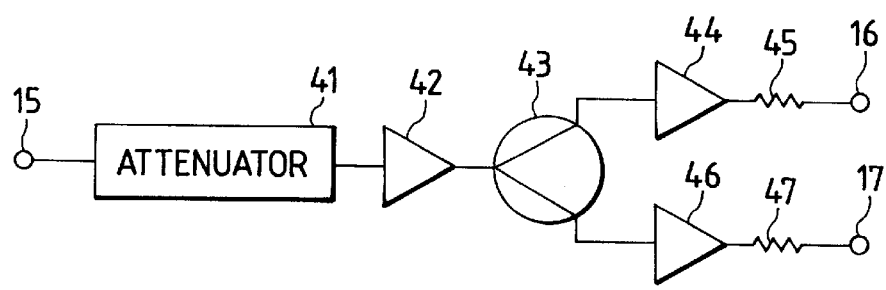
FIG. 7 is a block diagram of a distributor of the radio-frequency device.

FIG. 7 is a block diagram of the distributor 11. The distributor 11 comprises: the input terminal 15; an attenuator 41 connected to the input terminal 15; a first amplifier 42 connected to the output of the attenuator 41; a distributor 43 connected to the output of the first amplifier 42; a second amplifier 44 connected to one output of the distributor 43; a resistor 45 connected between the second amplifier 44 and the first output terminal 16; a third amplifier 46 connected to another output of the distributor 43; and a resistor 47 connected between the output of the third amplifier 46 and the second output terminal 17.

Since the amplifiers 42, 44, and 46 are internally disposed in this way, an input signal is little deteriorated. Even when plural distributors 11 are connected in series by using coupling portions 23, therefore, an input signal is little deteriorated, and a number of output signals can be obtained.

When a television broadcasting signal is supplied to the input terminal 15, the same signal outputs can be obtained from the first and second output terminals 16 and 17. Therefore, the signals can be supplied to plural independent television receivers.

Figure 8:
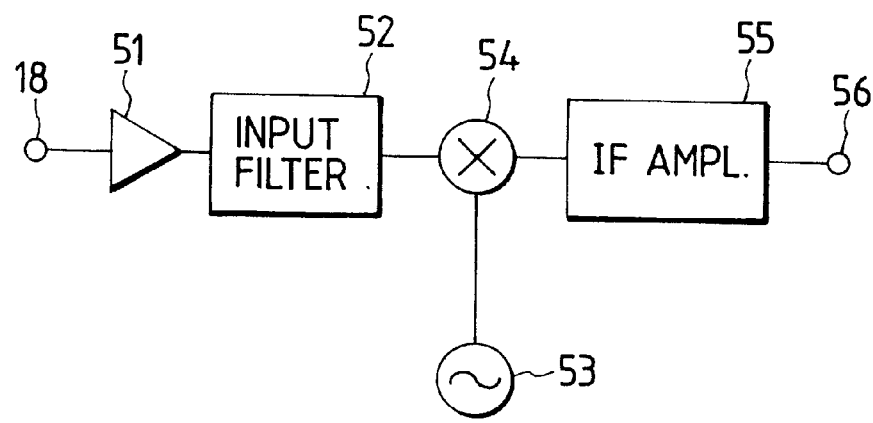
FIG. 8 is a block diagram of the tuner of the radio-frequency device.
Figure 9:
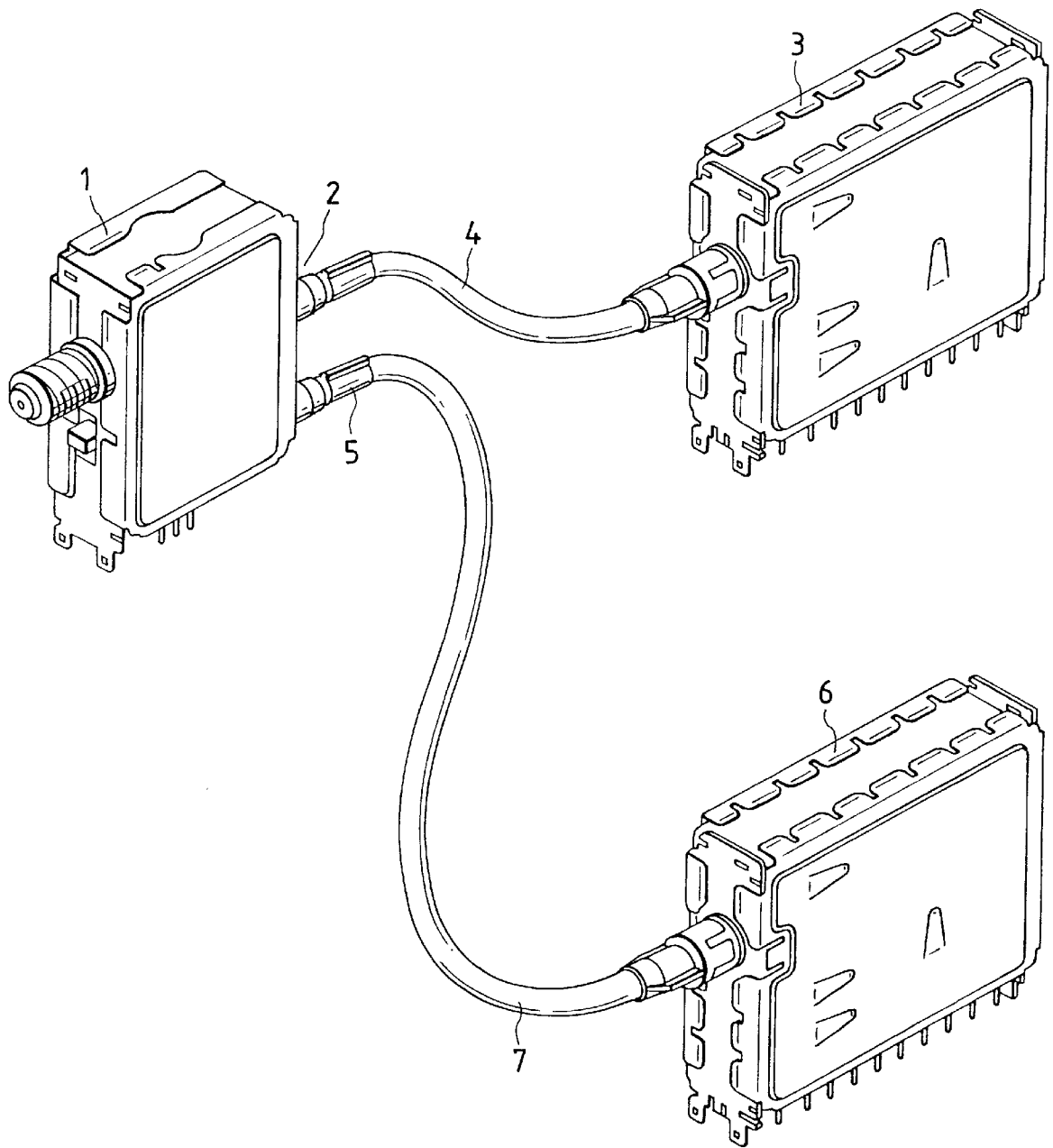
FIG. 9 is a perspective view of a radio-frequency device of the prior art.

FIG. 8 is a block diagram of the tuner 12. The tuner 12 comprises: the input terminal 18; a radio-frequency amplifier 51 connected to the input terminal 18; an input filter 52 connected to the output of the radio-frequency amplifier 51; a mixer 54 in which the output of the input filter 52 is connected to one input and the output of a local oscillator 53 is connected to another input; an intermediate frequency amplifier 55 to which the output of the mixer 54 is connected; and an output terminal 56 to which the output of the intermediate frequency amplifier 55 is connected.

When the tuner 12 is combined with the distributor 11 and the signal from the second output terminal 17 is supplied to another tuner, it is possible to enjoy a two-picture television, or to enjoy a television screen while recording another program.

As described above, according to the invention, the radio-frequency device comprises: a first radio-frequency unit; and a second radio-frequency unit which is detachably coupled to the first radio-frequency unit, the first and second radio-frequency units having a substantially same height and functioning independently of each other, each of the first and second radio-frequency units being housed in a metal case, the first radio-frequency unit has: an input terminal for a radio-frequency signal which is disposed on one side face of the case; and a first output terminal for a radio-frequency signal which is disposed on another side face, the first output terminal and an input terminal of the second radio-frequency unit are respectively protruded at positions which are separated from a bottom face by a substantially same distance, a metal flat plate portion is led out from the side of the first output terminal, and the flat plate portion is coupled to a receiving portion of the second radio-frequency unit on the side of the input terminal. Therefore, the first output terminal of the first radio-frequency unit is directly connected to the input terminal of the second radio-frequency unit, so that a radio-frequency cable for connecting the units to each other is not necessary. Consequently, a space reduction and a low production cost can be realized. Furthermore, external interfering signals hardly enter the device, and a chance of adversely affecting the external is lowered.

Since the units have independent functions, the units can be independently produced and adjusted. After the production and adjustment, the first and second radio-frequency units can be managed while they are coupled to each other so as to be in the "combined" state in accordance with users or destinations.

What is claimed is:

1. A radio-frequency device comprising:
   a first radio-frequency unit; and
   a second radio-frequency unit which is detachably coupled to said first radio-frequency unit, said first and second radio-frequency units having a substantially same height and functioning independently of each other, each of said first and second radio-frequency units being housed in a metal case;
   said first radio-frequency unit including:
      an input terminal for a radio-frequency signal which is disposed on one side face of said case; and a
      first output terminal for a radio-frequency signal which is disposed on another side face,
      wherein said first output terminal and an input terminal of said second radio-frequency unit are respectively disposed at positions which are separated from a bottom face by a substantially same distance, a metal flat plate portion is led out from the side of said first output terminal, and said flat plate portion is coupled to a receiving portion of said second radio-frequency unit on the side of said input terminal.

2. A radio-frequency device according to claim 1, wherein said input terminal of said first radio-frequency unit and said input terminal of said second radio-frequency unit are respectively protruded at positions which are separated from the bottom face by a substantially same distance.

3. A radio-frequency device according to claim 2, wherein each of said cases of said first and second radio-frequency units comprises a frame, and a cover which is fitted with said frame, and a contact portion disposed on said cover abut against the vicinities of each of said input terminals of said first and second radio-frequency units.

4. A radio-frequency device according to claim 3, wherein a second output terminal is disposed at a position on an upper side face, said position being separated from said input terminal and said first output terminal of said first radio-frequency unit by the same distance.

5. A radio-frequency device according to claim 1, wherein a phonoplug is protruded from said first output terminal of said first radio-frequency unit, and a phonojack is disposed in said input terminal of said second radio-frequency unit.

6. A radio-frequency device according to claim 5, wherein said first and second radio-frequency units are coupled with each other by fitting a projection disposed at a tip end of said flat plate portion into a hole formed in said receiving portion.

7. A radio-frequency device according to claim 5, wherein said first and second radio-frequency units are coupled with each other by fitting a projection disposed at a tip end of said flat plate portion into a recess formed in a side face of said receiving portion.

8. A radio-frequency device according to claim 4, wherein, in said first radio-frequency unit, an amplifier is connected between said input terminal and said first output terminal of said unit.

9. A radio-frequency device according to claim 1, wherein said second radio-frequency unit has an amplifier which amplifies an input signal.

10. A radio-frequency device according to claim 4, wherein said first radio-frequency unit comprises: said input terminal; an attenuator connected to said input terminal; a first amplifier connected to an output of said attenuator; a distributor connected to an output of said first amplifier; a second amplifier connected to one output of said distributor; said first output terminal to which an output of said second amplifier is supplied; a third amplifier connected to another output of said distributor; and said second output terminal to which an output of said third amplifier is supplied.

11. A radio-frequency device according to claim 10, wherein said second radio-frequency unit comprises: said input terminal; a radio-frequency amplifier connected to said input terminal; an input filter connected to an output of said radio-frequency amplifier; a mixer in which an output of said input filter is connected to one input and an output of a local oscillator is connected to another input; an intermediate frequency amplifier to which an output of said mixer is connected; and an output terminal to which an output of said intermediate frequency amplifier is connected.

* * * * *

UNITED STATES PATENT AND TRADEMARK OFFICE
CERTIFICATE OF CORRECTION

PATENT NO. : 5,913,173
DATED : June 15, 1999
INVENTOR(S) : Ohwaki et al.

It is certified that error appears in the above-indentified patent and that said Letters Patent is hereby corrected as shown below:

Column 4, Line 7, after "numeral", insert --15--.

Column 5, Line 28, delete "Improvement" and insert --improvement--.

Signed and Sealed this

Twenty-second Day of May, 2001

Attest:

NICHOLAS P. GODICI

Attesting Officer      Acting Director of the United States Patent and Trademark Office